United States Patent
Schaffroth et al.

(10) Patent No.: US 6,734,695 B2
(45) Date of Patent: May 11, 2004

(54) METHOD AND SEMICONDUCTOR COMPONENT HAVING A DEVICE FOR DETERMINING AN INTERNAL VOLTAGE

(75) Inventors: Thilo Schaffroth, Röhrmoos (DE); Ralf Schneider, München (DE)

(73) Assignee: Infineon Technologies AG, Munich (DE)

( * ) Notice: Subject to any disclaimer, the term of this patent is extended or adjusted under 35 U.S.C. 154(b) by 26 days.

(21) Appl. No.: 10/094,890

(22) Filed: Mar. 6, 2002

(65) Prior Publication Data

US 2002/0125906 A1 Sep. 12, 2002

(30) Foreign Application Priority Data

Mar. 6, 2001 (DE) .......................... 101 10 626

(51) Int. Cl.$^7$ ............................... G01R 31/26
(52) U.S. Cl. ...................... 324/765; 324/763
(58) Field of Search ................. 324/763, 765, 324/158.1; 714/733, 734; 365/226, 227, 201; 327/78, 89

(56) References Cited

U.S. PATENT DOCUMENTS 5,977,763 A * 11/1999 Loughmiller et al. .... 324/158.1
6,008,664 A * 12/1999 Jett et al. .................... 324/765
6,117,696 A    9/2000 Loughmiller et al.

* cited by examiner

*Primary Examiner*—Kamand Cuneo
*Assistant Examiner*—Tung X. Nguyen
(74) *Attorney, Agent, or Firm*—Laurence A. Greenberg; Werner H. Stemer; Gregory L. Mayback

(57) ABSTRACT

A method and a semiconductor component are described in which an internal voltage to be measured is divided via a matched voltage divider, and is passed to a selected connecting pin. Since there are normally no unused connecting pins, in, for example, present-day large scale integrated components, the connected module is disconnected from a selected connecting pin for a specific time period, and the divided measurement voltage is passed to the connecting pin. This is done by use of a controller, which operates appropriate switches. This method is preferably used for memory components such as DRAM, SRAM etc.

7 Claims, 1 Drawing Sheet

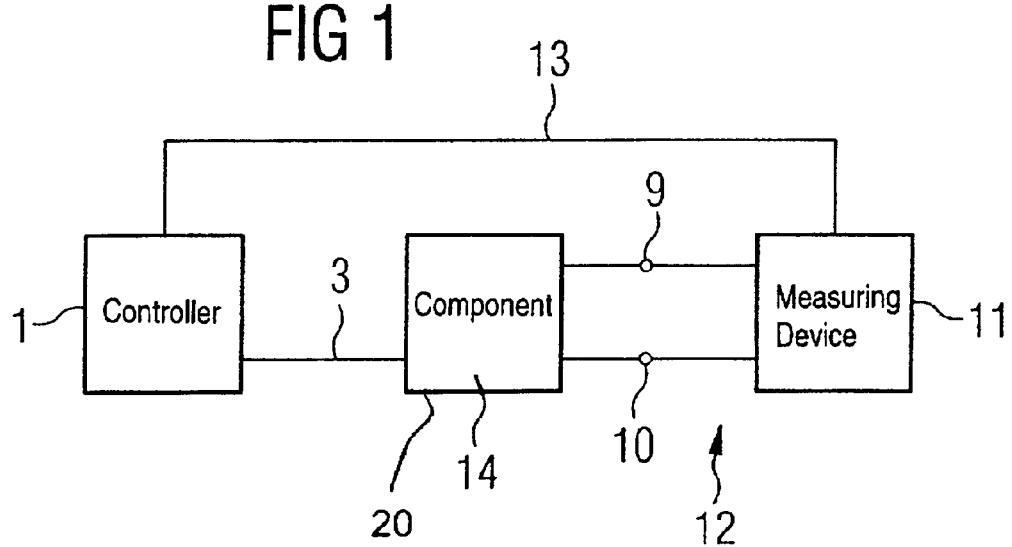
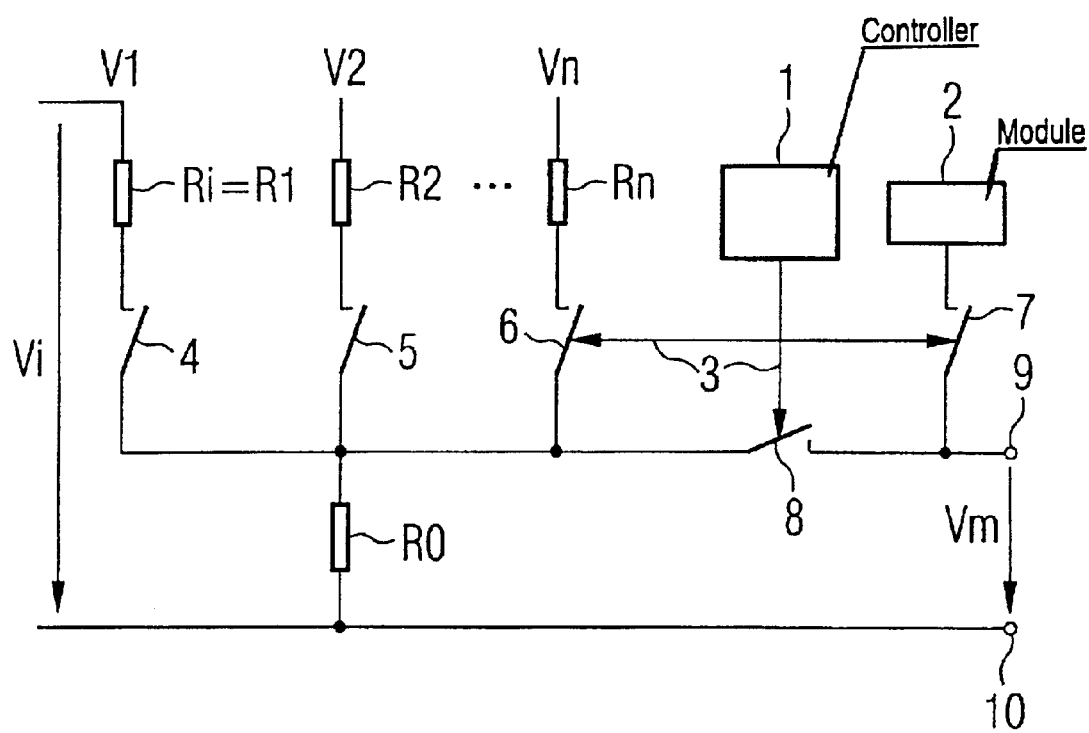

METHOD AND SEMICONDUCTOR COMPONENT HAVING A DEVICE FOR DETERMINING AN INTERNAL VOLTAGE

BACKGROUND OF THE INVENTION

Field of the Invention

The invention relates to a method and a semiconductor component, in particular an integrated circuit, in which, in addition to the operating voltage, there are one or more internal voltages.

One problem that frequently occurs in integrated (semiconductor) circuits which, owing to their complexity, are frequently accommodated in special housings with up to several hundred connecting pins, is that internal voltages which are generated by appropriate voltage sources cannot be measured at a connecting pin on the housing since, owing to the lack of line connections and the lack of free connecting pins, or as a result of standardization, they are not externally accessible.

On the other hand, during the production process, it is important to record the internal voltages when testing the components and for control of the production process, and then to assess the functions or the quality of that component. Problems such as these occur, for example, in computer chips or in memory components such as SRAM, DRAM, etc. By way of example, in the case of a DRAM module, the behavior of the module is governed by the magnitude of the boosted word line voltage. An excessively high or low voltage can result in it being impossible to either read or write the data and information. It is thus very important to check the voltage during the production process, to ensure that the component will carry out the desired functions during its subsequent use.

Until now, this problem has been circumvented by measuring the relevant internal voltages, using special measurement probes, just during the wafer-level test. However, appropriate measurement pads must be provided on the chip, for this measurement, to which the measurement probes can be applied. The method costs additional chip surface area, which is then no longer available for other functional modules.

It is also known for special housings (characterization housings) to be manufactured for measuring the internal voltages, which have appropriate connecting pins for the relevant internal voltages. The internal voltages are passed to the connecting pins, so that they can then be measured from the outside. This can, of course, only be carried out for a sample with a correspondingly small number of components, since the method is highly complex and costly. Furthermore, such components can no longer be sold, since they do not comply with the predetermined specifications.

SUMMARY OF THE INVENTION

It is accordingly an object of the invention to provide a method and a semiconductor component having a device for determining an internal voltage that overcomes the above-mentioned disadvantages of the prior art methods and devices of this general type.

With the foregoing and other objects in view there is provided, in accordance with the invention, a method for detecting an internal voltage in an integrated circuit. The integrated circuit receives an operating voltage and generates internal voltages, in which case the internal voltages cannot be measured directly via existing, isolated connecting pins of the integrated circuit. The method includes dividing the internal voltage using a voltage divider disposed within the integrated circuit resulting in a divided internal voltage. A controller disconnects a selected connecting pin for a predetermined time period by opening a switch from its previous connection to an internal circuit part resulting in a disconnected connecting pin. The divided internal voltage is applied to the disconnected connecting pin during the predetermined time period.

The invention is based on the object of temporarily changing the use of a connecting pin to allow the measurement of an internal voltage that is not directly accessible.

The method according to the invention has the advantage that internal voltages can be measured directly at one or more selected connecting pins on the housing. One particularly advantageous feature in this case is regarded as the fact that the voltages can be measured on all the components and that the components nevertheless still comply with their full electrical specification in accordance with the datasheet. It is also advantageous that the measurements can be repeated as often as desired, so that the internal voltages can, in particular, be checked during subsequent use, using suitable measurement methods. A further advantage is also the fact that the number of internal voltages to be measured is in practice unlimited, so that the method provides considerably better criteria for assessing the component quality. The additional technical complexity is, in contrast, negligibly small.

It is regarded as being particularly advantageous in this case that the voltage that is measured at the connecting pin, by a measuring device, can be multiplied by the division ratio of the associated voltage divider, thus producing the actual value of the internal voltage. There is then no need for any further conversion calculations.

It is also particularly advantageous for the division ratio of the voltage divider to be configured such that the measurement range that is produced does not cause any reaction with the rest of the circuit. This ensures that the component cannot be damaged by the measurement process.

If it is intended to measure a number of internal voltages, in particular, at different levels, and the voltage divider can be adapted as appropriate. This also advantageously results in that the measurement of the internal voltage cannot have any adverse effect on the component.

Particularly when a number of internal voltages are intended to be measured, the advantageous solution is to measure the voltages using a known multiplexing method. Therefore, the same connecting pin can always be used, for example, for the different measurements. This also considerably simplifies the interconnect routings within the semiconductor component.

Since individual chip surface areas are freely available for the formation of voltage dividers even in large scale integrated semiconductor components, it is possible to use chip surface areas such as these advantageously. In consequence, there is scarcely any influence on the existing layout.

For the semiconductor component, it may be important for the circuit part (module, receiver) that is disconnected during the measurement phase to retain its function at that time. Any change to the function could, for example, lead to a change in the internal voltage, and could thus cause an undesirable measurement error.

It is also advantageous for the semiconductor component that the voltage divider is used to divide the internal voltage to a safe level, which is applied to the connecting pin by appropriately configured switches. Any internal voltage can thus be applied to the connecting pin by switching the switches. Only a simple control action is required to do this, so that the switches can be controlled from the outside via control commands that are sent via an appropriate control bus.

With the foregoing and other objects in view there is provided, in accordance with the invention, an integrated circuit. The integrated circuit contains a housing, connecting pins disposed in the housing and isolated from one another, at least one circuit part having connections connected to the connecting pins, and at least one internal voltage source generating an internal voltage. At least one voltage divider is coupled to the internal voltage source and by which the internal voltage can be divided resulting in a divided internal voltage. Switches are provided for routing the divided internal voltage to a selected connecting pin of the connecting pins. The switches are connected between the voltage divider and at least one of the connecting pins.

Particularly in the case of a memory component such as DRAM or SRAM, this advantageously makes it possible to test internal voltages such as the word line voltage.

Transistor switches are fast switches that are relatively simple to produce, particularly when they are in the form of NMOS or PMOS switches (N-conductive or P-conductive metal oxide semiconductors). These types can easily be integrated, for example, in a dynamic random access memory (DRAM).

The connecting pins DQM, CKE or CS appear to be particularly suitable for the measurement of internal voltages, since the modules that are disconnected here can easily have their functions frozen.

Other features which are considered as characteristic for the invention are set forth in the appended claims.

Although the invention is illustrated and described herein as embodied in a method and a semiconductor component having a device for determining an internal voltage, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a block diagram of a measurement configuration for measuring an internal voltage according to the invention; and FIG. 2 is an equivalent circuit for performing the voltage measurement.

DESCRIPTION OF THE PREFERRED EMBODIMENTS

Referring now to the figures of the drawing in detail and first, particularly, to FIG. 1 thereof, there is shown, schematically, a semiconductor component 14 which is to be measured and may be a commercially available large scale integrated circuit, for example a microcomputer module, a memory module such as a DRAM or a SRAM, etc. To give it robustness and make it easier to handle, the semiconductor component 14 is fitted in a housing 20. Depending on the configuration of the semiconductor component 14, there may be a very large number of lines from modules 2 (FIG. 2), which are integrated on the semiconductor chip, to the connecting pins 9, 10 that are provided and are isolated per se on the housing. By way of example, in the case of a memory module, the connecting pins are required to transmit not only the operating voltage but also addresses, control commands and the data to be stored to the semiconductor chip, or else to read data, addresses, the status, etc. A number of lines are in this case combined to form a bus system, for example in the form of an address bus, data bus, control bus, etc.

In FIG. 1, the semiconductor component 14 is connected to a controller 1 via a control bus 3. The object of the controller 1 is not only to send control commands to control the functions of the semiconductor component 14, but also to check that the operations have been carried out. With regard to one or more internal voltages to be measured, the controller 1 carries out the function of routing the internal voltage Vi to be measured to a selected connecting pin 9, 10 by controllable switches 4 to 8 and voltage dividers Ri, Ro that are integrated in the semiconductor component 14. The details of the configuration will be described in more detail later with reference to FIG. 2.

In addition, the controller 1 also controls a measurement device 11 in order to synchronize the measurement process. The measurement device 11 is controlled via the control line 13.

The measurement device 11 is connected via measurement lines 12 to the connecting pins 9, 10 of the semiconductor component 14. The illustrated configuration should be regarded as being only schematic. In the exemplary embodiment, the connecting pin 9 is assumed to be the pin to which the divided, internal voltage Vm is passed. The connecting pin 10 represents the reference ground potential, that is to say the ground point. It is thus sufficient to divide an internal voltage Vi down using the internal voltage divider Ri, R0 (FIG. 2) and to apply this to the connecting pin 9. In the case of a DRAM memory component, the connecting pin 9 may correspond, for example, to the DQM, CKE or CS pin, via which the DQM signal, the CKE signal or the CS signal is passed.

An alternative embodiment of the invention also provides for a number of connecting pins 9 to be used, so that a number of voltages can then be measured simultaneously.

If, on the other hand, a number of internal voltages are intended to be measured via only one connecting pin 9, then they can advantageously be detected using known multiplexing methods.

Since only the divided internal voltage Vm can be measured at the connecting pin 9, the result that is indicated on the measurement device 11 must be multiplied by the division ratio of the associated voltage divider Ri, R0 in order to obtain the true voltage value. The multiplication can be carried out automatically, since the information relating to the voltage divider Ri, R0 which is used is known, for example by the controller 1.

FIG. 2 shows a schematic equivalent circuit for measuring one or more internal voltages Vi. The internal voltages are formed on the semiconductor chip itself by suitable voltage sources, and are required to supply or control individual functions. They may be greater than or less than the supply voltage that is supplied from the outside. Negative internal voltages can also be used for certain applications.

By way of example, FIG. 2 shows three internal voltages V1, V2 and, in general form, Vn. The internal voltages Vi are connected to voltage dividers Ri, R0, which are provided for this purpose, at a suitable point on the semiconductor chip.

By way of example, the internal voltage Vi=V1 is connected to the voltage divider which is formed from the series circuit Ri=R1, R0.

It can also be seen from FIG. 2 that the resistor R1 is active only when a switch 4 is closed. When the switch 8 is also closed, the divided internal voltage $$Vm1=(R0/(R0+R1))*V1$$

is applied to the two connecting pins 9, 10 in accordance with the generally applicable formula $$Vi/Vm=(R0+Ri)/R0$$

and can be measured by the measurement device 11. In this case, the division ratio is:

$$R0/(R0+R1).$$

This factor is always less than 1, so that the divided voltage Vm1 is always less than the internal voltage V1. Subject to the condition that the divided voltage is not intended to carry out any function in the rest of the semiconductor circuit, the division ratio can be chosen as appropriate. However, an excessively low internal resistance R0 is generally also not advisable, in order to avoid excessively loading the internal voltage during the measurement. The division ratio should thus be chosen such that no changes to the behavior of the component 14 occur.

The voltage divider R2, R0 is used in a corresponding manner for the internal voltage V2, so that this results in the second divided voltage $$Vm2=(R0/(R0+R2))*V2$$

for the second internal voltage V2 at the connecting pins 9, 10.

By analogy, the nth divided voltage for further internal voltages Vn and the associated voltage divider Rn, R0 is given by $$Vn=(R0/(R0+Rn))*Vn.$$

Since the voltage divider Ri, R0 allows the voltages to be measured to be divided down to virtually any desired values, it is possible to set a range so that multiplexing of the divided-down voltages can be carried out using exclusively only one transistor type, preferably an NMOS or a PMOS type, at the connecting pin 9. The restriction to one transistor type allows a simplified logic configuration and additional protection of the internal circuits (modules), in particular against external influences. Thus, interference voltages (ESD), undervoltages or overvoltages, for example, can occur at the connecting pin 9, which could damage the internal circuits.

As can also be seen from FIG. 2, the module 2 is normally connected to the connecting pin 9. For the time period of the measurement, the connection between the module 2 and the connecting pin 9 is disconnected by the switch 7, and the module 2 is thus disconnected. The controller 1 additionally drives the module 2 in order to ensure that the module 2 does not revert to an undesirable switching state.

The controller 1, which is already known from FIG. 1, now uses the control bus 3 to control the individual switches 4 to 8 using the multiplexing method. When no measurement is being carried out, the switch 7 is closed and the other switches are opened. The measurement cycle is activated by applying a specific command word via the control bus 3. The controller 1 now connects one, and only one, voltage divider Ri, R0, for example the voltage divider R1, R0, via the switches 4 and 8 to the connecting pin 9, with the switch 7 having previously been opened.

The switches 5 and 8 or 6 and 8, respectively, are closed for the second and nth internal voltages V2 and Vn. All the other switches are opened.

An alternative embodiment of the invention provides for the controller 1 itself to be integrated in the form of test logic on the semiconductor chip. The control logic is integrated on the semiconductor chip in any case in present-day complex integrated circuits, particularly in the case of memory components. The control logic also controls the switches 4 to 8. This has the advantage that only the command word need be entered on the control bus 3, and is then read and implemented by the test logic.

Any voltage may be detected as an internal voltage. In the case of a DRAM memory module, a boosted word line voltage is preferably detected via one connecting pin, using the described configuration.

We claim:

1. A method for detecting an internal voltage in an integrated circuit, the integrated circuit receiving an operating voltage and generating internal voltages, in which case the internal voltages cannot be measured directly via existing, isolated connecting pins of the integrated circuit, which comprises the steps of:

dividing the internal voltage using a voltage divider disposed within the integrated circuit resulting in a divided internal voltage;

using a controller for disconnecting a selected connecting pin for a predetermined time period by opening a switch from its previous connection to an internal circuit part; and applying the divided internal voltage to the selected connecting pin during the predetermined time period.

2. The method according to claim 1, which comprises using a measuring device for measuring the divided internal voltage applied to the selected connecting pin resulting in a measured value; and multiplying the measured value by a division ratio of the voltage divider.

3. The method according to claim 2, which comprises configuring the division ratio of the voltage divider such that a measurement range that is produced does not cause any reaction with a remainder of the integrated circuit.

4. The method according to claim 1, which comprises using an adaptable voltage divider as the voltage divider for different internal voltages.

5. The method according to claim 1, which comprises applying a plurality of individual internal voltages to be measured to the selected connecting pin using a multiplexing method.

6. The method according to claim 1, which comprises using a freely available area on the semiconductor chip to form the voltage divider.

7. The method according to claim 1, which comprises using the controller to disconnect the internal circuit part from the selected connecting pin and one of holds the internal circuit part in a state that it was in before the selected connecting pin is disconnected, and switches the internal circuit part to an operating mode desired for a measurement.

* * * * *